United States Patent [19]
Inoue

[11] Patent Number: 6,163,164
[45] Date of Patent: Dec. 19, 2000

[54] NOISE DETECTION CIRCUIT

[75] Inventor: Naoki Inoue, Tokyo, Japan

[73] Assignee: Mitsubishi Denki Kabushiki Kaisha, Tokyo, Japan

[21] Appl. No.: 09/309,292

[22] Filed: May 11, 1999

[30] Foreign Application Priority Data

Jan. 18, 1999 [JP] Japan ................... 11-009827

[51] Int. Cl.[7] .................................................. H03K 17/16
[52] U.S. Cl. .................................................. 326/21; 326/9
[58] Field of Search .................... 326/21, 9; 327/312, 327/310, 186, 100, 552

[56] References Cited

U.S. PATENT DOCUMENTS

| | | | |
|---|---|---|---|
| 4,282,488 | 8/1981 | Noeman et al. | 328/112 |
| 4,775,840 | 10/1988 | Ohmori et al. | 328/111 |
| 5,059,834 | 10/1991 | Tago et al. | 307/542 |
| 5,878,094 | 3/1999 | Nowak et al. | 375/349 |

FOREIGN PATENT DOCUMENTS

| | | |
|---|---|---|
| 61-107811 | 5/1986 | Japan . |
| 63-284923 | 11/1988 | Japan . |
| 2-88983 | 3/1990 | Japan . |
| 5-14144 | 1/1993 | Japan . |
| 5-276057 | 10/1993 | Japan . |
| 6-132792 | 5/1994 | Japan . |

*Primary Examiner*—David Nelms
*Assistant Examiner*—Thong Le
*Attorney, Agent, or Firm*—Burns, Doane, Swecker & Mathis, LLP

[57] ABSTRACT

In order to realize the object of the present invention, which is to provide a noise detection circuit which is capable of coping with any pulse width of noise, and also of properly detecting the noise pulses which are consecutively generated, the noise detection circuit comprises a level monitoring circuit for monitoring the logic level of a signal input to a peripheral circuit within a microcomputer that needs to receive an input signal having a logic high level constantly for a certain period; wherein the level monitoring circuit further comprises a NOT circuit that inverts the polarity of a level monitoring signal input from the peripheral device for determining a signal level monitoring period, and an OR circuit that performs an OR operation between the output from the NOT circuit and the signal input to the peripheral device.

9 Claims, 6 Drawing Sheets

NOISE DETECTION CIRCUIT

BACKGROUND OF THE INVENTION

1. Field of the Invention

The present invention relates to a noise detection circuit for monitoring signals input to a specific circuit such as a peripheral device installed in a microcomputer or the like, which requires input signals of a constant level for a predetermined period of time, so as to detect noise in the input signals.

2. Description of the Prior Art

Figure 12:
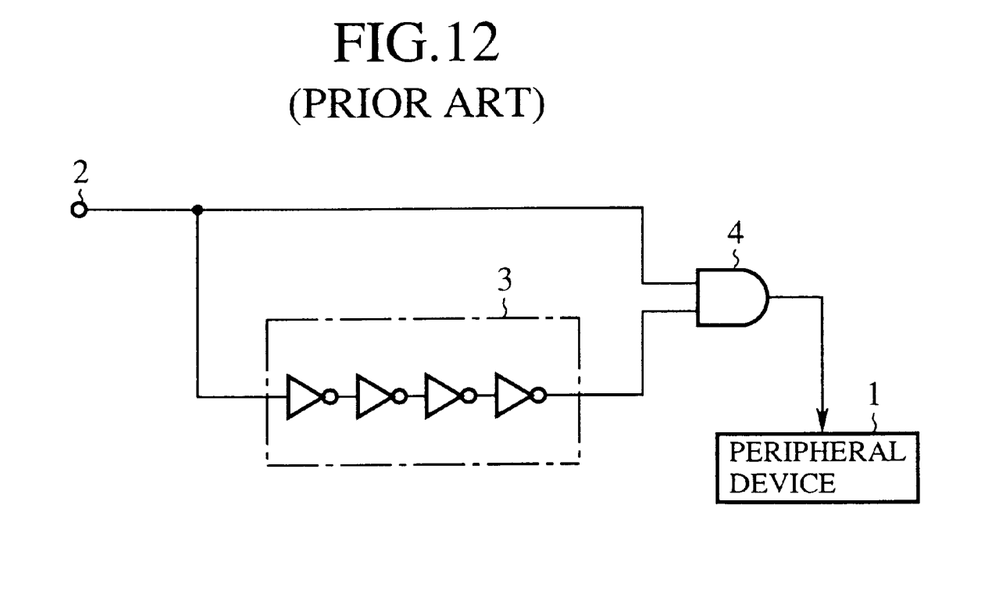
FIG. 12 is a schematic view showing a conventional noise detection circuit.

FIG. 12 is a schematic diagram showing a conventional noise detection circuit, and particularly showing here the configuration of a noise detection circuit for removing noise in the signals input to a peripheral device installed in a microcomputer.

In the figure, reference numeral 1 denotes a peripheral device installed in a microcomputer, numeral 2 denotes a signal input terminal through which signals are input to the peripheral device 1, numeral 3 denotes a delay circuit composed of even-numbered pieces of NOT circuits, and reference numeral 4 denotes a two-input AND circuit where an input signal fed from the signal input terminal 2 and an output from the delay circuit 3 are ANDed. It is to be noted that the noise removing circuit shown here is an example of a circuit for removing noise which is generated at the rise of an input signal.

The operation of the conventional noise detection circuit is explained as in the following.

Figure 13A:
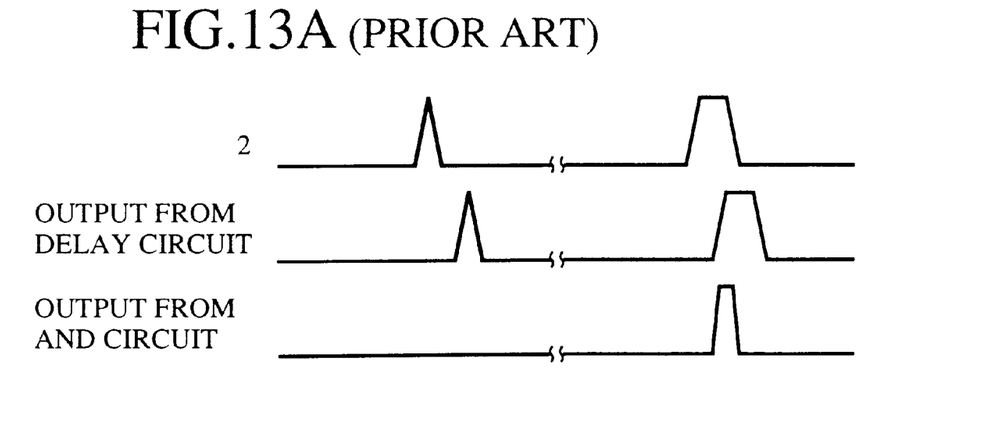
FIGS. 13A to 13C are an exemplary views each showing the waveform of each structural element of the conventional noise detection circuit.
Figure 13B:
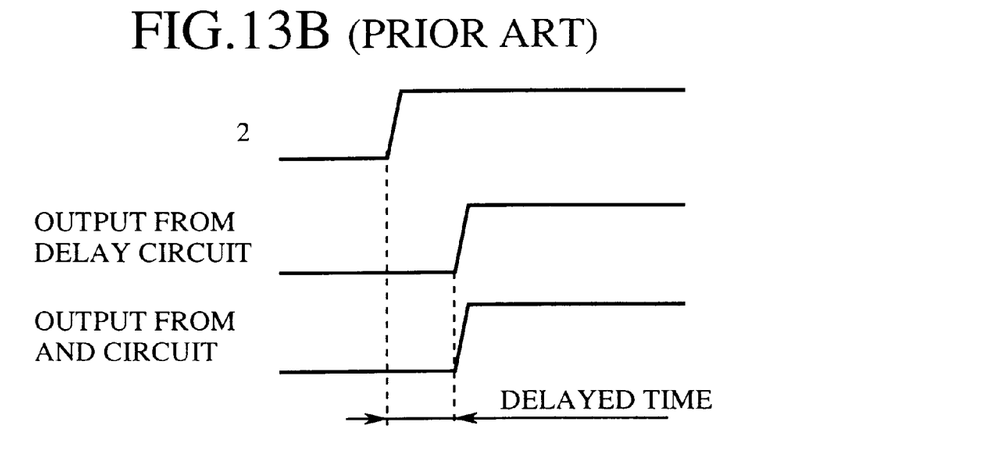
Figure 13C:
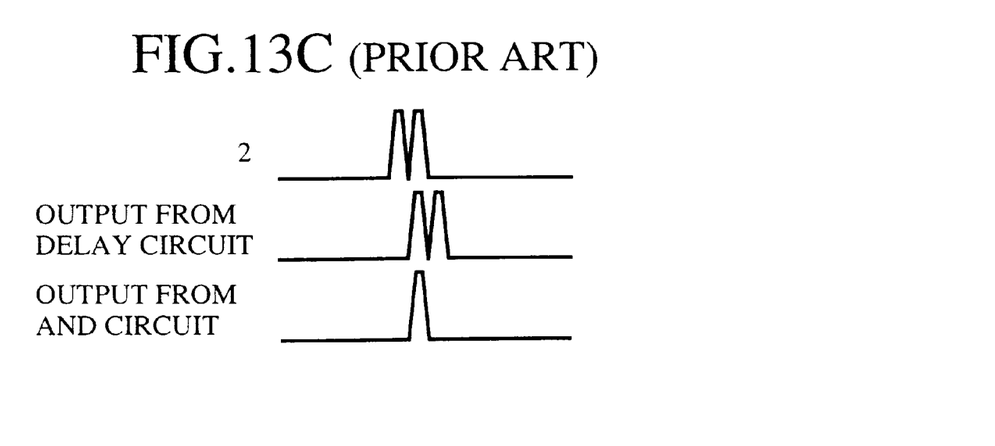

Here, FIGS. 13A, 13B and 13C are exemplary views each showing the waveform of each circuit element of the noise removing circuit shown in FIG. 12. FIG. 13A shows a noise removing operation performed by use of this noise removing circuit. FIG. 13B shows a noise removing operation in a case in which the time period delayed by the delay circuit 3 is relatively long, whereas FIG. 13C shows the operation in a case in which the noise pulses are consecutively generated.

Assuming that the pulse input through the signal input terminal 2 is a noise whose pulse width is shorter than the time interval delayed by the delay circuit 3, the signal pulse input through the signal input terminal 2 returns, as shown rather in the left side of FIG. 13A, to the low level (hereinafter may be referred to either as the "L"level, or just as "L") before the output from the delay circuit 3 becomes high level (hereinafter may be referred to either as the "H" level, or just as "H"). Consequently, the two signals input to the 2-input AND circuit 4 do not become "H" level simultaneously, but stay at the "L" level. In other words, the signal whose pulse width is shorter than the time interval delayed by the delay circuit 3 is removed as a noise, and thus not transmitted to the peripheral device 1.

On the other hand, assuming that the signal input through the signal input terminal 2 is a noise pulse whose pulse width is longer than the time interval delayed by the delay circuit 3, the level of the output from the delay circuit 3b then becomes also "H" as shown rather in the right side of FIG. 13A, during the period in which the signal pulse input through the signal input terminal 2 is still in the "H" level. Consequently, the two signals input to the 2-input AND circuit 4 also become "H" level. In other words, the signal whose pulse width is longer than the time interval delayed by the delay circuit 3 cannot be removed, and thus it is transmitted to the peripheral device 1 as a noise. In this way, the width of the noise can be determined depending on the time interval delayed by the delay circuit 3 in this noise removing circuit above.

However, if the delayed time interval is set too long for the purpose of removing the noise of a long pulse width, as shown in FIG. 13B, even when a correct waveform is input, the input signal delayed for the time interval determined by the delay circuit 3 is transmitted from the AND circuit 4 to the peripheral device 1, resulting that the timing set up for a signal input to the peripheral device 1 is also delayed.

Further, even when the pulse width of the noise is shorter than the time interval delayed by the delay circuit 3, there will be a problem if the pulses are consecutively input, it causes a problem. For example, as shown in FIG. 13C, in a case in which the noise of the former pulse delayed by the delay circuit 3 is output to one of the two inputs of the 2-input AND circuit 4, if the latter noise pulse which is not delayed is input to the other, the output from the 2-input AND circuit 4 becomes "H" in their superimposed range. Hence, the output from the 2-input AND circuit 4 is recognized as a rising signal in the peripheral device 1 that performs an edge sensing operation with respect to input signals, and accordingly the peripheral device 1 will possibly perform an unexpected erroneous operation.

Similar or related arts to the conventional noise detection devices as mentioned above are disclosed in such documents as; Japanese Patent Application Laid-Open Nos. 51-14144, 63-284923, 2-88983, 6-132792, 5-276057, and No. 61-107811.

Since the conventional noise detection circuit is configured as mentioned above, there are such drawbacks that the detectable noise width is varied in accordance with a time interval delayed by the delay circuit 3, and that the consecutively generated noise pulses cannot be detected properly.

SUMMARY OF THE INVENTION

The present invention has been proposed to solve the problems aforementioned, and it is an object of the present invention to provide a noise detection device which can cope with any pulse width of noise, and is capable of properly detecting also the noise pulses consecutively generated.

In order to achieve the above object, a noise detection circuit according to the first aspect of the present invention is configured such that a level monitoring circuit monitors for a certain level monitoring period the level of a signal input to a circuit that needs to receive an input signal having a constantly same logic level for a predetermined period of time.

A noise detection circuit according to the second aspect of the present invention is configured such that the level monitoring circuit therein further comprises; a NOT circuit that inverts the polarity of a level monitoring signal, which is input from the circuit that needs to receive an input signal having a logic high level constantly for a predetermined period for determining a signal level monitoring period, and an OR circuit that performs an OR operation between the output from the NOT circuit and a signal input to the circuit that needs to receive an input signal having a logic high level constantly for a predetermined period.

A noise detection circuit according to the third aspect according to the present invention is configured such that the level monitoring circuit further comprises; a NAND circuit that performs a NAND operation between a level monitoring signal for determining the certain level monitoring period, which is output from the circuit that needs to receive an input signal having a logic low level constantly for a predetermined period, and a signal input to the circuit that needs to receive an input signal having a logic low level constantly for a predetermined period.

A noise detection circuit according to the fourth aspect of the present invention is configured such that the level monitoring circuit further comprises; a timer for generating a level monitoring signal that determines the certain level monitoring period for monitoring the level of the input signal on the basis of the signal input to the circuit that needs to receive an input signal having a constantly same logic level for a predetermined period of time.

A noise detection circuit according to the fifth aspect of the present invention is configured such that the level monitoring circuit periodically monitors within the certain level monitoring period so as to detect whether the level of the signal input to the circuit that needs to receive an input signal having a constantly same logic level for a predetermined period of time, in accordance with a repetitive signal generated at a predetermined cycle.

A noise detection circuit according to the sixth aspect of the present invention is configured such that the circuit that needs to receive an input signal having a constantly same logic level for a predetermined period of time is a peripheral device installed within a microcomputer, and the level monitoring circuit, which detects whether the logic level of the signal input to the peripheral device is constant, is a CPU of the microcomputer, wherein the CPU is informed of the beginning of the level monitoring period from the peripheral device and monitors the level of the signal input to the peripheral device.

DETAILED DESCRIPTION OF THE PREFERRED EMBODIMENTS

Several embodiments of the present invention are now explained below.

First Embodiment

Figure 1:
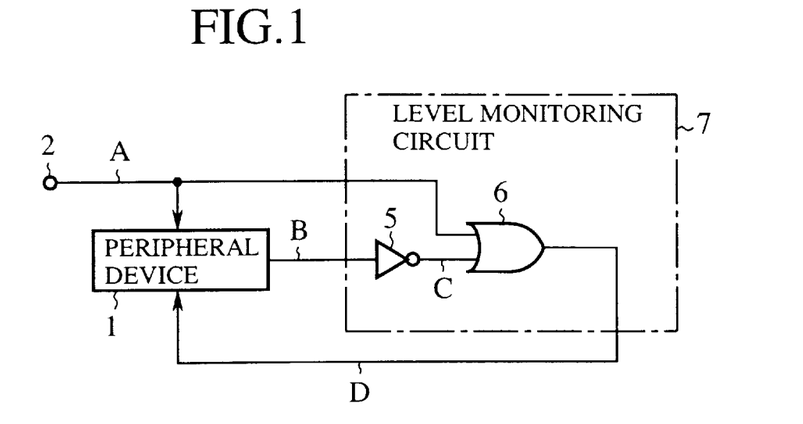
FIG. 1 is a schematic view showing a noise detection circuit according to a first embodiment of the present invention.

FIG. 1 is a schematic view showing a noise detection circuit according to the first embodiment of the present invention. In the figure, there is shown a circuit configuration of a circuit for monitoring the noise which may be generated with respect to the signal input to a peripheral device installed in a microcomputer. Reference numeral 1 denotes a peripheral device installed in a microcomputer, and is a circuit to which an input of a constant signal level "H" is required for a predetermined period of time. Reference numeral 2 denotes a signal input terminal by way of which a signal (signal A) is input to the peripheral device 1. Here, although these individual circuit elements in the noise detection circuit are identical with those denoted by the same reference numerals in the conventional circuit, the noise detection circuit of the present embodiment is different in that the peripheral device 1 outputs, at the beginning of the monitoring operation, a level monitoring signal B for determining a period of time equivalent to a predetermined period during which the logic level of the input signal A is supposed to be constant is monitored, so as to detect whether the level thereof is constant. It is to be noted that this peripheral device 1 is to output the level monitoring signal B in the "H" level for a certain period, and that the signal A input through the signal input terminal 2 is in the "H" level for a longer term than the period during which the signal B in "H" level is being output.

Reference numeral 5 denotes a NOT circuit that inverts the polarity of a level monitoring signal B, which the peripheral device 1 having received an input signal A in advance outputs at the beginning of the level monitoring operation, so as to generate the thus inverted signal C. Reference numeral 6 denotes a 2-input OR circuit which performs an OR operation between the inverted signal C from the NOT circuit 5 and the input signal A from the signal input terminal 2, and outputs an input signal abnormality detection signal D (which indicates abnormality generated in the input signal and hereinafter referred to just as an "abnormal input detection signal"). Reference numeral 7 denotes a level monitoring circuit formed by the NOT circuit 5 and the 2-input OR circuit 6.

The operation of the noise detection circuit according to the present embodiment is now explained below.

Figure 2:
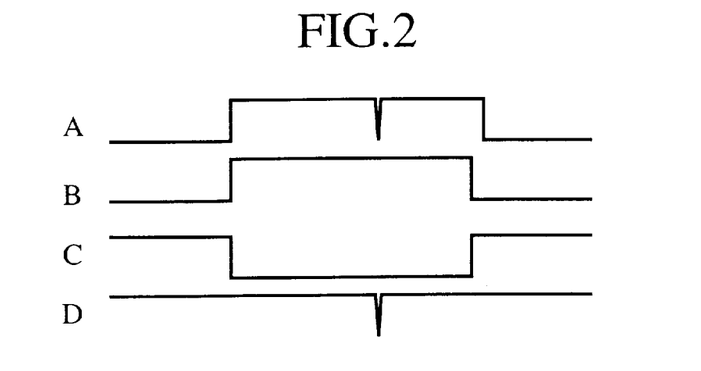
FIG. 2 is a timing chart showing the relationship among each of the signals in the first embodiment.

FIG. 2 is a timing chart indicating the time relation among each of the signals. As shown in FIG. 2, at the beginning of the operation, the signal A input through the signal input terminal 2 is in the "L" level. In this state, since the peripheral device 1 does not perform a level sensing operation yet, the level monitoring signal B output from the peripheral device 1 is in the "L" level. The level monitoring signal B fed from the peripheral device 1 is inverted at the NOT circuit 5, and then fed to the OR circuit 6 thereafter as the inverted signal C having the level "H". In this way, since the inverted signal C fed to the 2-input NOT circuit 6 becomes "H" level, the level of the abnormal input detection signal D transmitted from the level monitoring circuit 7 to the peripheral device 1 becomes "H".

Thereafter, the level of the input signal A fed from the signal input terminal 2 is changed from "L" to "H". When the peripheral device 1 detects the rise of the input signal A, it starts level sensing operation, whereby the level of the level monitoring signal B becomes "H". The level monitoring signal B fed from the peripheral device 1 is inverted at the NOT circuit 5, so that the thus inverted signal C is changed to the level "L", and fed to the OR circuit 6. In this way, since the inverted signal C fed from the NOT circuit 5 to the OR circuit 6 is fixed to the "L" level, the level of the output from the OR circuit 6 is determined in accordance with the level of the input signal A fed from the signal input terminal 2. Due to this, if the input signal A fed from the signal input terminal 2 is changed from "H" to "L" even momentarily during the period in which the peripheral device 1 is performing the level monitoring operation (namely, during the period in which the level monitoring signal B is in the "H" level), the level of the abnormal input detection signal D, which is transmitted from the level monitoring circuit 7 to the peripheral device 1, falls to the "L" level, and a signal indicating abnormality is thereby given to the peripheral device 1.

As mentioned heretofore, according to the first embodiment of present invention, if the input signal A fed from the signal input terminal 2 is changed from "H" to "L" even momentarily, the level of the abnormal input detection signal D is set to the "L" level, and a signal indicating abnormality is provided to the peripheral device 1. Therefore, in a case in which there is a signal pulse input through the signal input terminal 2 to the peripheral device 1 whose level is other than "H" during a predetermined time period, it can be detected as a noise irrespective of the width and/or the consecutive occurrence thereof.

Second Embodiment

Figure 3:
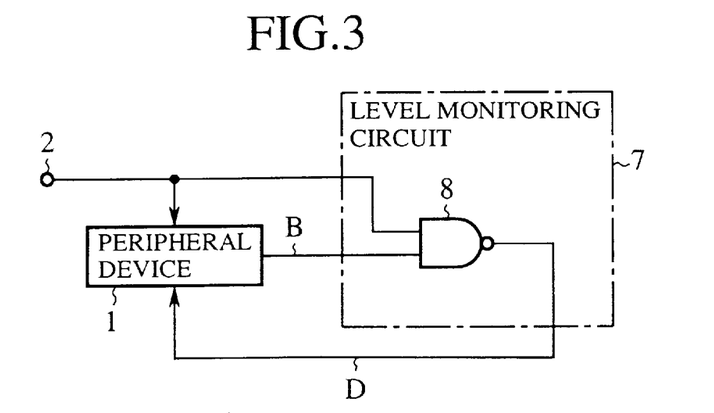
FIG. 3 is a schematic view showing a noise detection circuit according to a second embodiment of the present invention.

The noise detection circuit according to the first embodiment is explained to be one which, in the case that there is an input through the signal input terminal 2 to the peripheral device 1 whose level is other than "H" during a predetermined time period, detects it as a noise. However, it can also be arranged such that the noise detection circuit detects it to be a noise, if there is an input through the signal input terminal 2 to the peripheral device 1 whose level is other than "L" during the predetermined time period. FIG. 3 is a schematic diagram showing a noise detection circuit according to a second embodiment of the present invention, wherein there is shown a circuit configuration of a circuit for monitoring noise which may be generated with respect to the input signal fed to a peripheral device installed in a microcomputer. It is to be noted that a detailed explanation about the portions already explained with reference to FIG. 1 is omitted here by putting the identical reference numerals.

In FIG. 3, reference numeral 8 denotes a 2-input NAND circuit, which generates an abnormal input detection signal D to be fed to the peripheral device 1, by inverting the result of NAND operation performed between a level monitoring signal B for determining a level monitoring period output from the peripheral device 1, which is a circuit that needs to input a signal having a constant level "L" for a predetermined period of time, and an input signal A fed to the peripheral device 1. It is to be noted that the configuration of the level monitoring circuit 7 of the present embodiment is different from that of the first embodiment, as it is formed only by a 2-input NAND circuit 8.

The operation of the noise detection circuit according to the present embodiment is now explained below.

Figure 4:
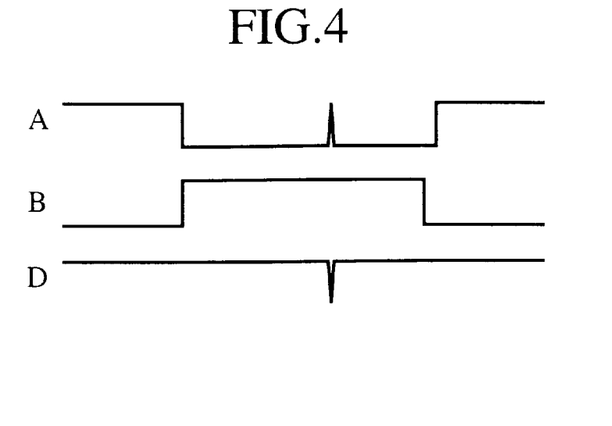
FIG. 4 is a timing chart showing the relationship among each of the signals in the second embodiment.

FIG. 4 is a timing chart showing the time relation among each of the signals in the noise detection circuit according to the second embodiment. In this case, the level of the signal input through the signal input terminal 2 is "H" at the beginning of the operation. In this state, since the peripheral device 1 does not perform a level sensing operation yet, the level monitoring signal B fed from the peripheral device 1 is still in the "L" level, and is input to the 2-input NAND circuit 8 as it is. In this way, since the level monitoring signal B fed to the 2-input NAND circuit is in the "L" state, the level of the abnormal input detection signal D transmitted from the level monitoring circuit 7 to the peripheral device 1 becomes "H".

Thereafter, the level of the input signal A fed from the signal input terminal 2 is changed from "H" to "L". The peripheral device 1 starts level sensing operation at the falling of the input signal A, and sets the level of the level monitoring signal B to "H". The level monitoring signal B from the peripheral device 1 is fed to the 2-input NAND circuit 8. In this way, since the level of the level monitoring signal B fed to the 2-input NAND circuit 8 is fixed to the "H" level, the level of the abnormal input detection signal D is determined in accordance with the level of the input signal A fed through the signal input terminal 2. Due to this, if the input signal A fed from the signal input terminal 2 is changed to the "H" level even momentarily during the period in which the peripheral device 1 is monitoring (namely, during the period in which the level monitoring signal B is in the "H" level), the level of the abnormal input detection signal D, which is transmitted from the level monitoring circuit 7 to the peripheral device 1, falls to the "L" level, and a signal indicating abnormality is thereby given to the peripheral device 1.

As mentioned above, according to the second embodiment of present invention, if the input signal A fed from the signal input terminal 2 is changed to "L" even momentarily, the level of the abnormal input detection signal D falls to the "L" level, and a signal indicating abnormality is provided from the level monitoring circuit 7 to the peripheral device 1. Therefore, in a case in which there is a signal input from the signal input terminal 2 to the peripheral device 1, whose signal level is other than "L" during the predetermined time period, it can be detected as a noise, irrespective of the width and/or the consecutive occurrence of the noise.

Third Embodiment

Figure 5:
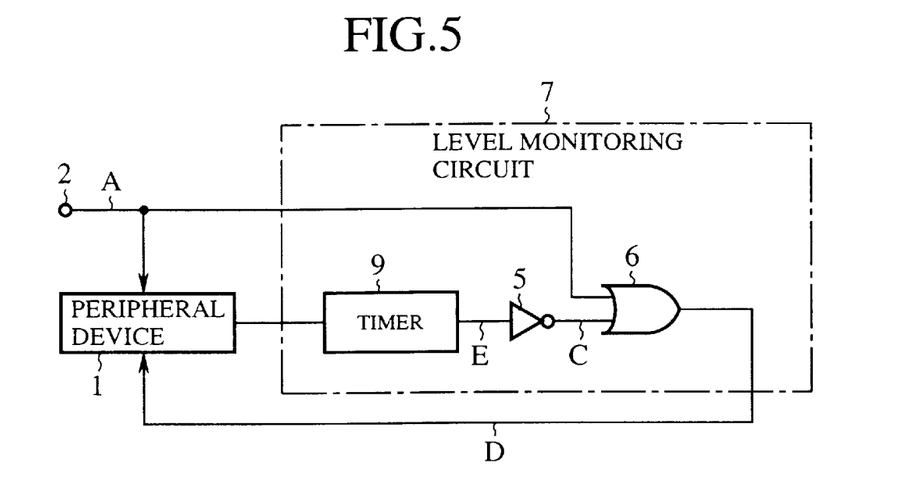
FIG. 5 is a schematic view showing a noise detection circuit according to a third embodiment of the present invention.

Although in the above embodiments there is shown the case in which the level monitoring signal B, which determines the level monitoring period for monitoring the level of the input signal A fed to the peripheral circuit 1, is output from the peripheral device 1, it can also be arranged such that the level monitoring signal B is generated from the input signal A. FIG. 5 is a schematic diagram of a noise detection circuit according to a third embodiment of the present invention, wherein there is shown the configuration of a circuit for monitoring noise generated with respect to the input signal fed to the peripheral device 1 installed in a microcomputer. It is to be noted that a detailed explanation about the portions already explained with reference to FIG. 1 is omitted here by putting the identical reference numerals.

In FIG. 5, reference numeral 9 denotes a timer which generates a level monitoring signal E for determining a level monitoring period during which the level of the input signal A is monitored on the basis of the input signal A fed from the signal input terminal 2 to the peripheral device 1. This timer 9 operates at the rise of the input signal A as its trigger signal, and outputs the level "H" and "L" respectively when it is operating and when not. It is to be noted that the general configuration of the level monitoring circuit 7 of the present embodiment is different from that of the first embodiment in that the level monitoring circuit 7 of the present embodiment is composed of a timer 9, a NOT circuit 5 and a 2-input OR circuit 6.

The operation of the noise detection circuit according to the third embodiment is now explained below.

Figure 6:
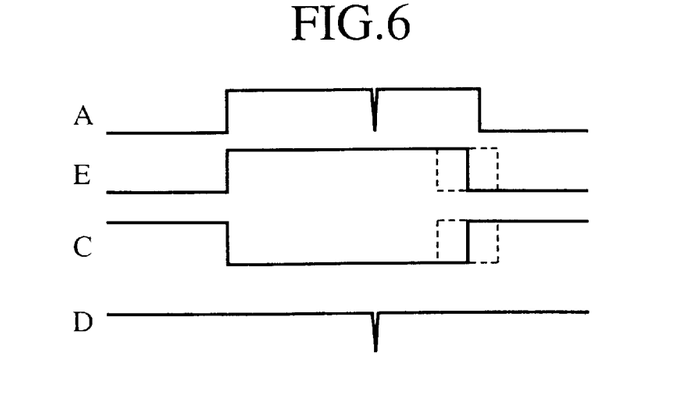
FIG. 6 is a timing chart showing the relationship among each of the signals in the third embodiment.

FIG. 6 is a timing chart showing the relation among each of the signals in the noise detection circuit according to the third embodiment. In this case as well, the level of the signal A input through the signal input terminal 2 is "L" in its operation starting state. In this state, since the timer 9 is not in the operating state, the level of the level monitoring signal E output from the peripheral device 1 is in the "L" level, and is inverted at the NOT circuit 5 to the "H" level, and the thus inverted signal is fed to the 2-input OR circuit 6 as the inverted signal C. In this way, since the inverted signal C fed to the 2-input OR circuit 6 is in the "H" level, the level of the abnormal input detection signal D transmitted from the level monitoring circuit 7 to the peripheral device 1 becomes "H".

Thereafter, the level of the input signal A fed from the signal input terminal 2 is changed from "L" to "H". The timer 9 starts operating at the rise of the input signal A, and sets the level of the level monitoring signal E to "H". The time period, during which the level monitoring signal E is in the "H" level, is variable in accordance with the set value of the timer 9 as indicated by dashed lines in FIG. 6. The level monitoring signal E in the level "H" fed from the timer 9 is inverted at the NOT circuit 5 to level "L", and is fed to the 2-input OR circuit as the inverted signal C. In this way, since the level of the level monitoring signal E fed to the 2-input OR circuit 6 is fixed to the "L" level, the level of the abnormal input detection signal D is determined in accordance with the level of the input signal A fed through the signal input terminal 2. Due to this, if the input signal A fed from the signal input terminal 2 is changed to the "H" level even momentarily during the period in which the peripheral device 1 is monitoring (namely, during the period in which the level monitoring signal E is in the "H" level), the level of the abnormal input detection signal D, which is transmitted from the level monitoring circuit 7 to the peripheral device 1, is set to the "L" level, and a signal indicating abnormality is thereby provided to the peripheral device 1.

As explained heretofore, according to the third embodiment of present invention, since the time period of the level monitoring signal E, which determines the level monitoring period for monitoring the signal level of the input signal A, varies in accordance with the operating period of the timer 9, the level monitoring period can be selected freely in accordance with the preset time period of the timer 9.

It is to be noted that in the above explanation, there is shown a noise detection circuit which, by combining it with the before-mentioned first embodiment, can detect noise when there is an input signal whose level is other than "H" fed from the signal input terminal 2 to the peripheral device 1 during the predetermined period. However, another type of noise detection circuit can be provided, which, by combining it with the before-mentioned second embodiment, can detect noise when there is an input signal whose level is other than "L" during the predetermined period.

Fourth Embodiment

Figure 7:
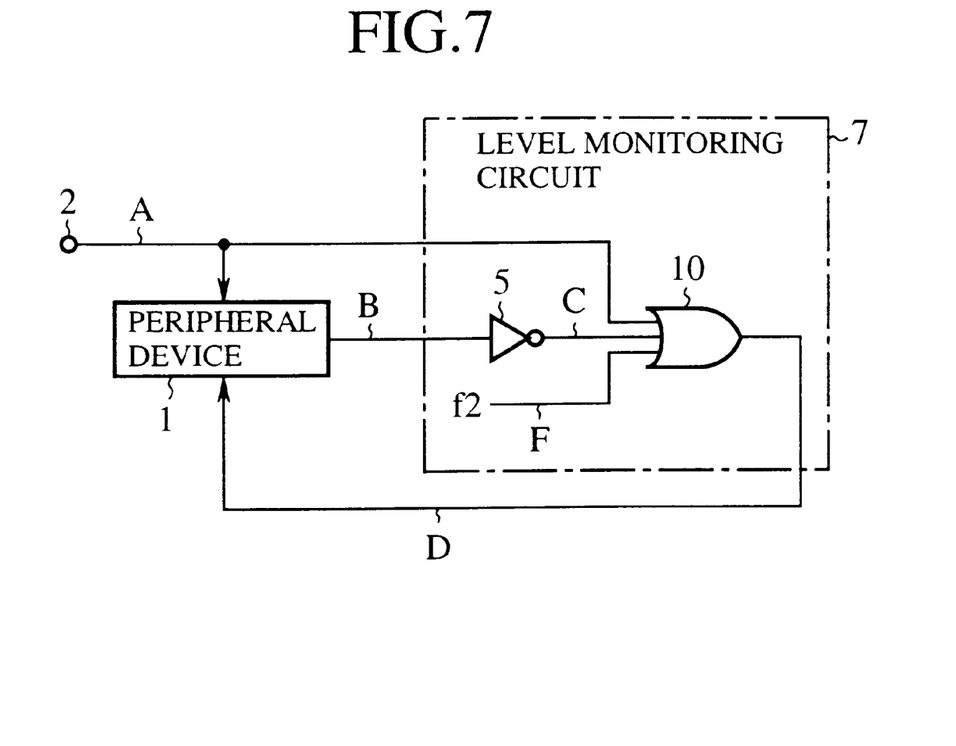
FIG. 7 is a schematic view showing a noise detection circuit according to a fourth embodiment of the present invention.
Figure 8:
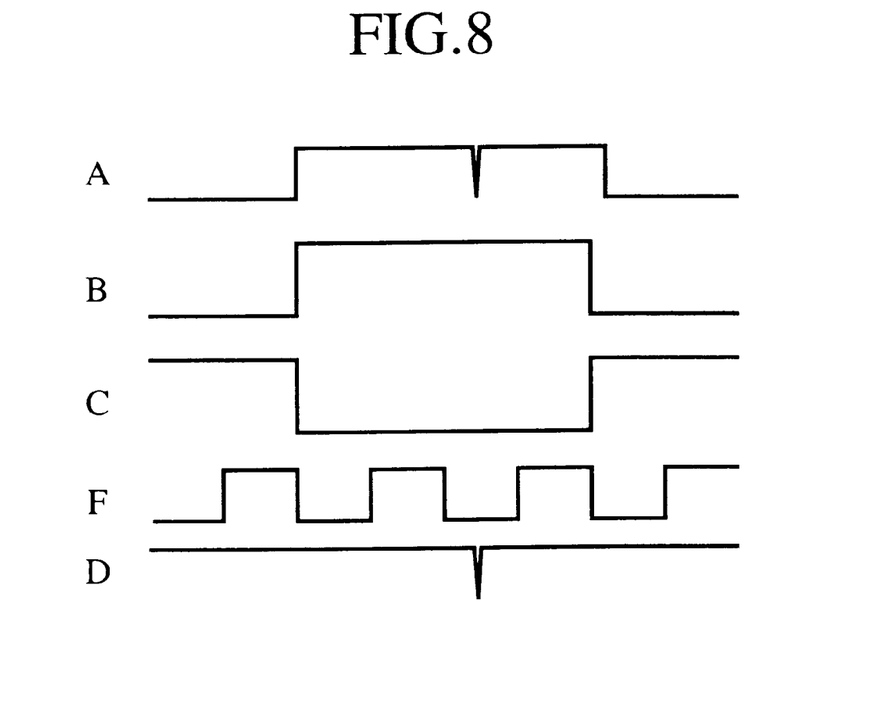
FIG. 8 is a timing chart showing the relationship among each of the signals in the fourth embodiment.

Although in the above embodiments, there is shown the case in which the level of a signal input through the signal input terminal 2 is monitored throughout the entire level monitoring period, it can be arranged such that the level of a signal input through the signal input terminal 2 is monitored periodically. FIG. 7 is a schematic diagram showing a noise detection circuit according to a fourth embodiment of the present invention, wherein there is shown the configuration of a circuit for monitoring noise with respect to the input signal fed to the peripheral device 1 installed in a microcomputer. It is to be noted that a detailed explanation about the portions already explained with reference to FIG. 1 is omitted here by putting the identical reference numerals.

In the figure, reference numeral 10 denotes a 3-input OR circuit that performs an OR operation among the inverted signal C fed from the NOT circuit 5, an input signal A fed through the signal input terminal 2, and a repetitive signal F generated at a predetermined cycle, which is generated by dividing into half the clock pulse frequency for activating the microcomputer, in order to generate an abnormal input detection signal D.

It is to be noted that the configuration of the level monitoring circuit 7 of the present embodiment is different from that of the first embodiment in that it is composed of a 3-input OR circuit 10, a NOT circuit 5, and also a repetitive signal F. In other words, in this fourth embodiment, the 2-input OR circuit 6 of the first embodiment is replaced by a 3-input OR circuit 10.

The operation of the noise detection circuit according to the fourth embodiment of the present invention is now explained below.

FIG. 7 is a timing chart indicating the time relation among each of the signals. In this case as well, as shown in FIG. 7, in its starting operation, the level of the signal A input through the signal input terminal 2 is "L". In this state, since the peripheral device 1 does not perform a level sensing operation yet, the level of the level monitoring signal B output is in the "L" level. The level monitoring signal B fed from the peripheral device 1 is inverted at the NOT circuit 5, and is further input to the 3-input OR circuit 10 as an inverted signal C. Consequently, the output from the 3-input OR circuit 10 is set to the "H" level regardless of the signal input state of the other signals, whereby an abnormal input detection signal D in the "H" level is fed to the peripheral device 1 from the level monitoring circuit 7.

Thereafter, when the level of the input signal A fed from the signal input terminal 2 is changed from "L" to "H", the peripheral device 1 starts level sensing operation, and sets the level of the level monitoring signal B to the "H" level. The level monitoring signal B output from the peripheral device 1 is inverted at the NOT circuit 5, so that the thus inverted signal C in the "L" level is input to the OR circuit 10. It is to be noted that a signal f2 which is generated by dividing the clock pulse frequency into half is also input to the 3-input OR circuit 10 as a repetitive signal F. Consequently, during the time period in which the repetitive signal F is in the "L" level, the output level of the 3-input OR circuit 10 is determined by the level of the input signal A fed from the signal input terminal 2. Due to this, during the time period in which the peripheral device 1 is sending the level monitoring signal B in the "H" level, the level of the input signal A input from the signal input terminal 8 is monitored periodically at the ½ of the clock pulse frequency, and if it is lowered to the "L" level even momentarily, the abnormal input detection signal D in the level "L" level is transmitted from the level monitoring circuit 7 to the peripheral device 1, so that the occurrence of abnormality is informed to the peripheral device 1.

As explained above, according to the fourth embodiment of the present invention, the input signal A can be monitored only during the time period in which the signal f2 generated by dividing the clock pulse frequency into half is in the "L" level within the level monitoring period, so that the level of the input signal A can be monitored periodically at a predetermined cycle.

It is to be noted that in this case as well, by combining with the second embodiment, another type of noise detection circuit can be provided, which is capable of detecting noise when there is an input having the level other than "L" during a predetermined time period.

Fifth Embodiment

Figure 9:
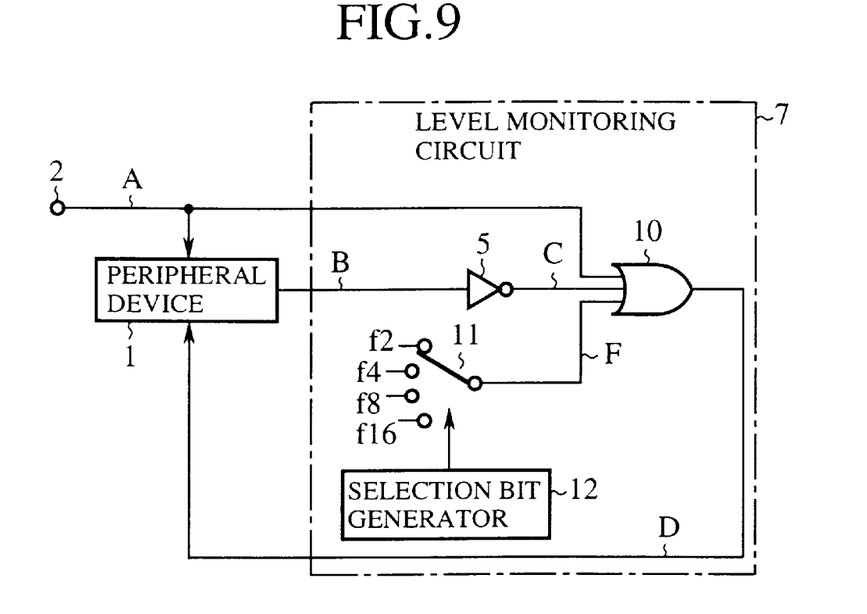
FIG. 9 is a schematic view showing a noise detection circuit according to a fifth embodiment of the present invention.

In the above-mentioned fourth embodiment, it is explained the case that the level of the input signal A during the level monitoring period by use of a signal f2 generated by dividing the clock pulse frequency as a repetitive signal F is monitored at a fixed cycle. However, it can also be arranged such that by use of a repetitive signal F which is selected from a plural kinds of frequency-divided signals, the level of the input signal A is monitored at an optimum cycle during the time period in which the level thereof is being monitored. FIG. 9 is a schematic diagram of a noise detection circuit according to the fifth embodiment of the present invention, wherein a circuit configuration of a circuit, which monitors the noise with respect to the input signal fed to the peripheral device installed in a microcomputer, is shown. It is to be noted that a detailed explanation about the portions already explained with reference to FIG. 7 is omitted here by putting the identical reference numerals.

In FIG. 9, reference numeral 11 denotes a switching circuit that selects either one of the signals, namely f2, f4, f8 and f16, which are generated respectively by dividing the clock pulse frequency by 2, 4, 8 and 16, and inputs the thus selected signal as a repetitive signal F to the 3-input OR circuit 10, and reference numeral 12 denotes a selection bit generator for controlling the selecting operation of the switching circuit 11. It is to be noted that the general configuration of the level monitoring circuit 7 of the present embodiment is different from that of the fourth embodiment in that it is provided with the switching circuit 11 and the selection bit generator 12.

The operation of the level monitoring circuit 7 according to the fifth embodiment is now explained below.

The noise detection circuit 5 here according to the fifth embodiment basically operates in the same manner as that of the fourth embodiment. However, it is arranged such that either one of the signals f2, f4, f8 and f16, which are generated respectively by dividing the clock pulse frequency can be selected as the repetitive frequency F. In other words, the switching circuit 11 is controlled by the selection bit generator 12 to select either one of the ½ frequency f2, ¼ frequency f4, ⅛ frequency f8 and ¹⁄₁₆ frequency, and then inputs the thus selected one as the repetitive signal F into the 3-input OR circuit 10. Thereafter, it operates just like in the case of the fourth embodiment, and if the level of the input signal A is set to "L" even momentarily in the state that the repetitive frequency F is in the "L" level, the level monitoring circuit 7 sets the abnormal input detection signal D to the "L" level, so that the occurrence of abnormality in the input signal A is informed to the peripheral device 1.

In this way, according to the fifth embodiment, as the level of the input signal A is monitored only when the repetitive signal F selected by the switching circuit 11 is in the "L" level, the cycle at which the input signal A is periodically monitored during the level monitoring period can be selected, so that monitoring the input signal A at an optimum cycle selected among a plurality of cycles is enabled.

It is to be noted that even in this case, by combining this embodiment with the second embodiment, a noise detection circuit of another type can be provided, which is capable of detecting noise when there is an input whose level is other than the "L" level during a predetermined time period.

Sixth Embodiment

Figure 10:
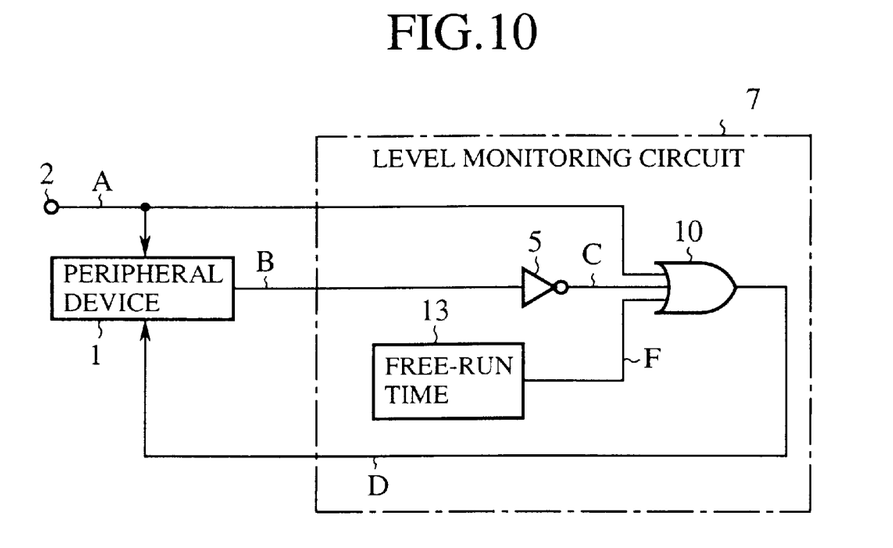
FIG. 10 is a schematic view showing a noise detection circuit according to a sixth embodiment of the present invention.

In the above fifth embodiment, there is shown the case in which either one of the signals, namely f2, f4, f8 and f8 and so on, which are all generated by dividing a clock pulse frequency, can be selected as a repetitive frequency F. However, it can be arranged such that a repetitive frequency F is generated by a free-run timer, and the level of the input signal A during the level monitoring operation is being conducted is monitored periodically by use of the repetitive frequency F. FIG. 10 is a schematic diagram showing a noise detection circuit according to the sixth embodiment of the present invention, wherein a circuit configuration of a circuit, which monitors the noise with respect to the input signal to the peripheral device installed in a microcomputer, is shown. It is to be noted that a detailed explanation about the portions already explained with reference to FIG. 7 is omitted here by putting the identical reference numerals.

In FIG. 10, reference numeral 13 denotes a free-run timer which can be freely set in terms of time, generate a repetitive signal F having a preset time as its cycle, and also outputs the thus generated signal F to the 3-input OR circuit 10. It is to be noted that the general configuration of the level monitoring circuit 7 in this embodiment is different from that of the fifth embodiment in that the switching circuit 11 and the selection bit generator 12 have been replaced by the free-run timer 13.

The operation of the level monitoring circuit 7 according to the present embodiment is now explained as below.

The free-run timer 13 is preliminarily provided with a predetermined cycle for monitoring the level of the input signal A periodically during the level monitoring period. The free-run timer 13 performs its operation in accordance with the thus preset cycle, and generates the repetitive signal F periodically at the preset cycle. The repetitive signal F output from the free-run timer 13 is fed to the 3-input OR circuit 10. Thereafter, the level monitoring circuit 13 operates just like the case of the fifth embodiment, and if the level of the input signal A falls to the level "L" even momentarily during the time period in which the repetitive signal F is in the "L" level, the level monitoring circuit 7 sets the level of the abnormal input detection signal D to "L", so that the occurrence of abnormality is informed to the peripheral device 1.

As explained above, since the level monitoring circuit monitors the input signal A during the period in which the repetitive signal F generated by the free-run timer 13 is in the "L" state, the cycle at which the input signal A is monitored periodically during the level monitoring period can be freely selected, so that the level of the input signal A can also be monitored at an optimum cycle.

It is to be noted that in this case as well, by combining this embodiment with the second embodiment, a noise detection circuit of another type can also be provided, which is capable of detecting noise when there is an input having the level other than "L" during a predetermined time period.

Seventh Embodiment

Figure 11:
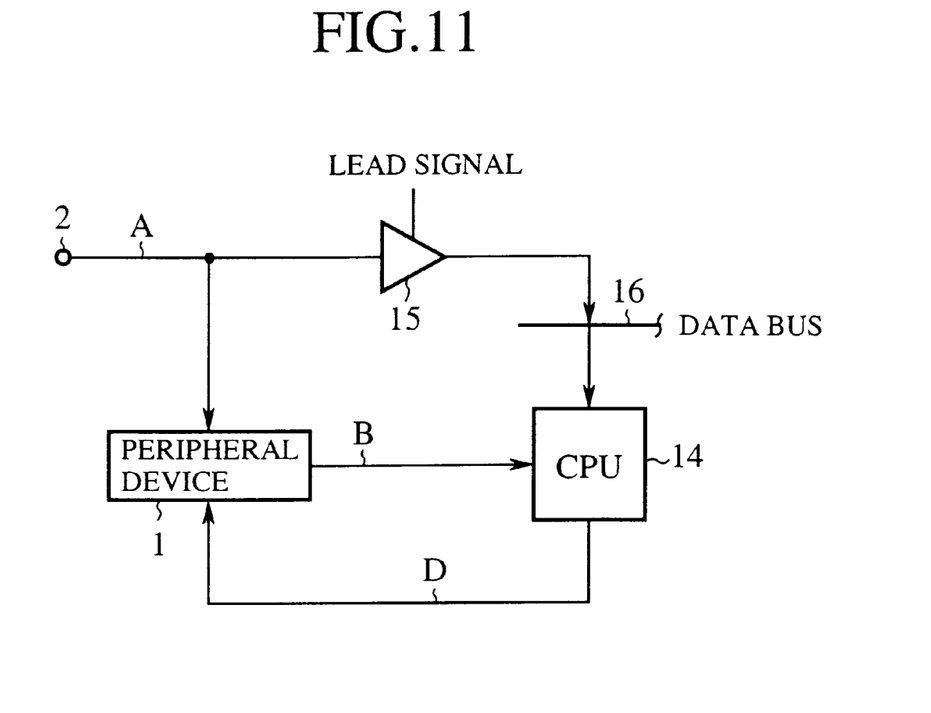
FIG. 11 is a schematic view showing a noise detection circuit according to a seventh embodiment of the present invention.

In each of the above embodiments, there is shown the case in which another separately provided circuit is employed for constructing the level monitoring circuit 7. However, if the circuit that requires one constant level of input signal during a predetermined period is a peripheral device 1 installed in a microcomputer, the level monitoring circuit 7 can make use of the CPU in the corresponding microcomputer. FIG. 11 is a schematic block diagram showing the noise detection circuit according to the seventh embodiment of the present invention. It is to be noted that a detailed explanation about the portions already explained with reference to FIG. 1 is omitted here by putting the identical reference numerals.

In FIG. 11, reference numeral 14 denotes a CPU in the microcomputer, which operates as a level monitoring circuit for monitoring the level of the input signal A. Reference numeral 15 denotes a buffer circuit for reading out the level of the input signal A fed through the input terminal 2, and numeral 16 denotes a data bus connecting the buffer circuit 15 and the CPU 14. In this way, the data processing device according to the seventh embodiment of the present invention is different from that in each of the other embodiments in that it monitors the level of the input signal A by use of the CPU 14 of the microcomputer.

The operation of the noise detection circuit according to the seventh embodiment is now explained below.

At the beginning of the operation, the signal A input through the signal input terminal 2 is in the "L" level. In this state, since the peripheral device 1 does not perform a level sensing operation yet, the level monitoring signal B in the level "L" is output. The level of the level monitoring signal B output from the peripheral device 1 is fed to the CPU 14, and the CPU 14, in turn, transmits an abnormal input detection signal D in the "H" level to the peripheral device 1. Thereafter, the level of the input signal A fed from the signal input terminal 2 is changed from "L" to "H". When the peripheral device 1 detects the rise of the input signal A, it starts level sensing operation, so that the level of the level monitoring signal B becomes "H". When the CPU 14 is informed of the beginning of the level monitoring period by the level monitoring signal B, it sends a lead signal to the buffer circuit 15 so as to make the buffer circuit 15 read the level of the input signal A. The thus read level of the input signal A is fed to the CPU 14 by way of the data bus 16. The CPU 14 monitors the input signal for a certain period of time to detect whether the signal is in the same level for a predetermined period, and when the level thereof is lowered even momentarily to the "L" level, it changes the level of the abnormal input detecting signal D, which is normally input to the peripheral device 1, to the level "L", thereby the occurrence of abnormality in the signal is informed to the peripheral device 1.

In this way, according to the seventh embodiment of the present invention, since the monitoring of the input signal A is performed by use of the CPU 14, a noise circuit detection circuit, which is capable of recognizing all inputs whose level is other than the level "H" during a predetermined period as the noise, irrespective of the time width, the consecutive occurrence of the noise and so forth, even without provision of any specific monitoring circuit or the like.

It is to be noted that in this case as well, by combining with the second embodiment, a noise detection circuit capable of detecting noise when there is an input having the level other than "L" during a predetermined time period is made possible.

According to the present invention, as it is configured such that a level monitoring circuit is provided for monitoring the logic level of a signal for a certain level monitoring period, which signal is input to a circuit that needs to receive an input signal of a constant logic level for a predetermined time period, when the logic level of the input signal is changed to the level other than the predetermined constant level even momentarily, the occurrence of abnormality is informed to the circuit that needs to receive an input signal of a constant logic level for a predetermined period, by changing the level of an input abnormal detection signal, so that a noise detection circuit, which is capable of recognizing all inputs whose level is other than the predetermined level as the noise, irrespective of the time width, consecutive occurrence of the noise and so forth, can be provided.

According to the present invention, since the noise detection circuit is configured such that a level monitoring circuit provided for monitoring the logic level of a signal for a certain level monitoring period is formed by a NOT circuit and an OR circuit, wherein the signal is input to a circuit that needs to receive an input signal of a constant logic level "H" for a predetermined time period, when the logic level of the input signal is changed to the level other than the predetermined constant level "H" for a predetermined level monitoring period, all inputs having the level other than "H" can be recognized as noise, irrespective of the time width, the consecutive occurrence of the noise and so on.

According to the present invention, since the noise detection circuit is configured such that a level monitoring circuit provided for monitoring the logic level of a signal for a certain level monitoring time period is formed by a NAND circuit, wherein the signal is input to a circuit that needs to receive an input signal of a constant logic level "L" for a predetermined time period, when the logic level of the input signal is changed to the level other than the predetermined constant level "L" during a certain level monitoring period, all inputs having the level other than "L" can be recognized as a noise, irrespective of the time width, consecutive occurrence of the noise and so forth.

According to the present invention, since the noise detection circuit is configured such that a level monitoring signal for determining a level monitoring period is generated in accordance with a time period set by a timer which is triggered by a signal input to a circuit that needs to receive an input signal of a constant logic level for a predetermined period of time, only by setting a time period for the timer, the time width of the level monitoring signal determining the level monitoring time period can be freely set.

According to the present invention, since the noise detection circuit is configured such that the monitoring operation of the logic level of a signal is performed in accordance with a repetitive signal generated at a predetermined cycle, the monitoring operation of the signal input to the circuit can be performed periodically at a predetermined cycle only in the period during which the repetitive signal is in the predetermined level within the level monitoring period.

According to the present invention, since the noise detection circuit is configured such that a CPU of a microcomputer monitors whether the level of a signal input to a peripheral device installed in the microcomputer is constant during a predetermined time period, a noise detection circuit capable of recognizing all inputs whose level is other than the predetermined constant level, irrespective of time width of the noise, consecutive occurrence of the noise and so forth can be provided, even without any specific level monitoring circuit.

What is claimed is:

1. A noise detection circuit for detecting noise with respect to a signal input to a circuit that needs to receive an input signal having a constantly same logic level for a predetermined period of time; said noise detection circuit comprising:

a level monitoring circuit, which receives a) an output signal, from said circuit, indicating a certain level monitoring period and b) said input signal and which monitors the level of said input signal based upon said output signal, so as to detect whether the logic level of said input signal is constant during said certain level monitoring period.

2. The noise detection circuit according to claim 1, wherein said level monitoring circuit comprises;

a NOT circuit that inverts a polarity of a level monitoring signal for determining said certain level monitoring period, which is output from said circuit that needs to receive the input signal having a logic high level constantly for the predetermine period, and an OR circuit that performs an OR operation between an output from said NOT circuit and the signal input to said circuit that needs to receive the input signal having the logic high level constantly for the predetermined period.

3. The noise detection circuit according to claim 1, wherein said level monitoring circuit comprises;

a NAND circuit that performs a NAND operation between a level monitoring signal for determining said certain level monitoring period, which is output from said circuit that needs to receive the input signal having a logic low level constantly for the predetermined period, and the signal input to said circuit that needs to receive the input signal having the logic low level constantly for the predetermined period.

4. The noise detection circuit according to claim 2, wherein said level monitoring circuit further comprises;

a timer for generating the level monitoring signal that determines said certain level monitoring period for monitoring the level of the input signal on the basis of said signal input to said circuit that needs to receive the input signal having the constantly same logic level for the predetermined period of time.

5. The noise detection circuit according to claim 1, wherein said level monitoring circuit periodically monitors within said certain level monitoring period so as to detect whether the level of the signal input to said circuit that needs to receive the input signal having the constantly same logic level for the predetermined period of time in accordance with a repetitive signal generated at a predetermined cycle.

6. The noise detection circuit according to claim 5, wherein said circuit that needs to receive the input signal having the constantly same logic level for the predetermined period of time is a peripheral device within a microcomputer, and wherein said repetitive signal is generated by dividing a clock pulse frequency activating the microcomputer.

7. The noise detection circuit according to claim 6, wherein said level monitoring circuit further comprises a switching means for selecting one of a plurality of repetitive signals generated by dividing a clock pulse frequency into a plural numbers.

8. The noise detection circuit according to claim 6, wherein said repetitive signal is generated by a free-run timer.

9. The noise detection circuit according to claim 1, wherein said circuit that needs to receive the input signal having the constantly same logic level for the predetermined period of time is a peripheral device installed within a microcomputer, and said level monitoring circuit, which detects whether the logic level of the signal input to said peripheral device is constant, is a CPU of said microcomputer, said CPU being informed of a beginning of said level monitoring period from said peripheral device and monitoring the level of the signal input to said peripheral device.

* * * * *

UNITED STATES PATENT AND TRADEMARK OFFICE
CERTIFICATE OF CORRECTION

PATENT NO. : 6,163,164
DATED : December 19, 2000
INVENTOR(S) : Naoki Inoue

It is certified that error appears in the above-identified patent and that said Letters Patent is hereby corrected as shown below:

<u>Title page,</u>
Second assignee is added:
 Item [75] Assignee: Mitsubishi Electric System LSI Design Corporation, Hyogo, Japan Signed and Sealed this Sixth Day of November, 2001

Attest:

NICHOLAS P. GODICI
*Attesting Officer*    *Acting Director of the United States Patent and Trademark Office*